US008838053B2

(12) United States Patent
Lin et al.

(10) Patent No.: US 8,838,053 B2
(45) Date of Patent: Sep. 16, 2014

(54) FREQUENCY MULTIPLICATION USING SELF-MIXING

(75) Inventors: Li Lin, Saratoga, CA (US); Xiang Gao, San Jose, CA (US); Chi-Hung Lin, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 232 days.

(21) Appl. No.: 13/449,468

(22) Filed: Apr. 18, 2012

(65) Prior Publication Data

US 2012/0276857 A1  Nov. 1, 2012

Related U.S. Application Data

(60) Provisional application No. 61/480,947, filed on Apr. 29, 2011, provisional application No. 61/484,110, filed on May 9, 2011.

(51) Int. Cl.
*H04B 1/18* (2006.01)
*H03B 19/00* (2006.01)

(52) U.S. Cl.
CPC ........................................ *H03B 19/00* (2013.01)
USPC ............. 455/189.1; 455/216; 455/20; 331/53

(58) Field of Classification Search
CPC ....... H03L 7/0812; H03L 7/18; H03L 7/0992; H03L 7/23; H03L 7/08; H03L 2207/10
USPC ............... 455/189.1, 216, 20, 293, 22, 191.3; 331/53, 16
See application file for complete search history.

(56) References Cited

U.S. PATENT DOCUMENTS

| | | | | | |
|---|---|---|---|---|---|
| 3,961,172 | A | * | 6/1976 | Hutcheon | 708/813 |
| 3,983,501 | A | * | 9/1976 | Lindstrum | 329/307 |
| 4,017,682 | A | * | 4/1977 | Tojo | 348/724 |
| 4,053,713 | A | * | 10/1977 | Nitadori | 370/206 |
| 4,642,490 | A | | 2/1987 | Lawton | |
| 4,751,575 | A | * | 6/1988 | Noske | 348/537 |
| 5,034,703 | A | * | 7/1991 | Schumacher | 331/2 |
| 5,111,508 | A | * | 5/1992 | Gale et al. | 381/100 |
| 5,592,131 | A | * | 1/1997 | Labreche et al. | 332/103 |
| 5,774,788 | A | * | 6/1998 | Hannah et al. | 455/12.1 |
| 2002/0125924 | A1 | | 9/2002 | Kurogouchi | |
| 2005/0245200 | A1 | * | 11/2005 | Kluge et al. | 455/76 |
| 2006/0144448 | A1 | * | 7/2006 | Goody | 137/599.01 |

FOREIGN PATENT DOCUMENTS

EP        1313210 A1    5/2003

OTHER PUBLICATIONS

Gray, Paul R. et al., "Analysis and design of analog integrated circuits," Jan. 1, 1993, Analysis and Design of Analog Integrated Circuits, New York, J.Wiley, US, pp. 593-598, XP002245777.

(Continued)

*Primary Examiner* — Minh D Dao

(57) ABSTRACT

Frequency multipliers having corresponding methods and multifunction radios comprise: N multipliers, wherein N is an integer greater than one; wherein the multipliers are connected in series such that each of the multipliers, except for a first one of the multipliers, is configured to mix a periodic input signal with an output of another respective one of the multipliers; wherein the first one of the multipliers is configured to mix the periodic input signal with the periodic input signal.

20 Claims, 10 Drawing Sheets

(56) References Cited

OTHER PUBLICATIONS

Notification of Transmittal of the International Search Report and the Written Opinion of the International Searching Authority, or the Declaration dated Oct. 16, 2012 in reference to PCT/US2012/034108 (17 pgs).

Puyal, V. et al., "A broad-band active frequency doubler operating up to 120 GHz," European Gallium Arsenide and Other Semiconductor Application Symposium, GAAS 2005 Oct. 3, 2005, Piscataway, NJ, USA, IEEE, Piscataway, NJ, USA, Oct. 3, 2005, pp. 557-560, XP031823431, ISBN: 978-88-902012-0-2.

* cited by examiner

US 8,838,053 B2

FREQUENCY MULTIPLICATION USING SELF-MIXING

CROSS-REFERENCE TO RELATED APPLICATIONS

This disclosure claims the benefit of U.S. Provisional Patent Application Ser. No. 61/480,947, filed on Apr. 29, 2011 and U.S. Provisional Patent Application Ser. No. 61/484,110, filed May 9, 2011, the disclosures thereof incorporated by reference herein in their entirety.

FIELD

The present disclosure relates generally to the field of electronic circuits. More particularly, the present disclosure relates to frequency multiplication.

BACKGROUND

In electronic circuits it is frequently desirable to modify the frequency of a periodic signal such as a clock signal or local oscillator output. For example, in devices such as wireless transceivers, a voltage-controlled oscillator (VCO) is often used to provide a periodic signal for downconverting received RF signals, upconverting signals to RF for transmission, as the basis for clock signals, and the like. Generally the VCO output cannot be used directly as a clock signal due to power amplifier pulling. That is, some of the power may leak from the power amplifier to the VCO. If the VCO and power amplifier run at similar frequencies, the VCO frequency may be pulled away from its center frequency and towards the power amplifier frequency. In addition, multiple clocks at different frequencies may be required to support multiple standards in a single device.

Frequency multiplication is often used to accomplish such modifications. One common application is frequency tripling, where a circuit triples the frequency of an input signal. FIG. 1 shows a conventional circuit that is widely used for frequency tripling. The circuit of FIG. 1 includes a capacitor C1, a resistor R1, a bipolar junction transistor Q1, and a tank circuit comprising an inductor L1 and a variable capacitor C2. A sinusoidal input signal Sin having an input frequency Fin is applied to the circuit. Transistor Q1 is chosen such that the input signal Sin drives transistor Q1 into a non-linear region of operation where higher-order harmonics are generated. The value of variable capacitor C2 is tuned so that the tank circuit acts as a bandpass filter to pass the third harmonic Fout=3Fin in output signal Sout.

One disadvantage of the approach of FIG. 1 is that substantial power is required to drive transistor Q1 strongly into the non-linear operating region. Therefore this approach is not suitable for battery-powered devices such as mobile telephones and the like. Another disadvantage of the approach of FIG. 1 is that the spectrum of the output signal is rich in unwanted frequency components referred to as "spurs." In particular, output signal Sout includes a strong spur at the input frequency.

In some cases it is desirable to increase the frequency of a signal fractionally. FIG. 2 shows a conventional circuit for multiplying the frequency of a signal by 3/2. In the circuit of FIG. 2, a periodic input signal Sin having a frequency Fin that is ⅔ of the desired output frequency Fout is applied to a divider 202. Divider 202 divides the frequency Fin of signal Sin by 2 such that the signal Sdiv output by divider 202 has a frequency Fin/2=Fout/3. Multiplier 204 mixes the input signal Sin with the signal Sdiv output by divider 202. This mixing generates two tones (2Fout/3+/−Fout/3), one tone at Fout/3 and the other at Fout. An LC tank at the output of multiplier 204 acts as a bandpass filter to pass the Fout tone and to suppress the Fout/3 tone. Therefore the signal Sout output by multiplier 204 has a frequency Fout=3Fin/2.

One disadvantage of the approach of FIG. 2 is that the circuit produces a spur at the frequency Fout/3. Because the output of divider 202, and one input of multiplier 204, operate at the frequency Fout/3, a spur at frequency Fout/3 is generated in signal Sout by mixing and coupling. Such spurs also appear in the supply/substrate current, and so are propagated to the rest of the circuit or chip, where the spurs can reduce performance cause circuit malfunctions, and the like.

SUMMARY

In general, in one aspect, an embodiment features a frequency multiplier comprising: N multipliers, wherein N is an integer greater than one; wherein the multipliers are connected in series such that each of the multipliers, except for a first one of the multipliers, is configured to mix a periodic input signal with an output of another respective one of the multipliers; wherein the first one of the multipliers is configured to mix the periodic input signal with the periodic input signal.

Embodiments of the frequency multiplier can include one or more of the following features. In some embodiments, the periodic input signal has a fundamental frequency Fin, and the frequency multiplier further comprises: a bandpass filter configured to pass an output frequency Fout, wherein Fout=(N+1)×Fin. Some embodiments comprise a phase shifter configured to shift a phase of the periodic input signal; wherein the first one of the multipliers is further configured to mix the periodic input signal with the periodic input signal subsequent to the phase shifter shifting the phase. Some embodiments comprise a phase detector configured to determine a phase of a signal output by the first one of the multipliers; wherein the phase shifter is further configured to shift the phase of the periodic input signal in accordance with the phase of the signal output by the first one of the multipliers. Some embodiments comprise a Gilbert cell, wherein the Gilbert cell comprises the first one of the multipliers; and a transconductance stage.

In general, in one aspect, an embodiment features a method comprising: receiving a periodic input signal; generating a first mixed signal, comprising mixing the periodic input signal with the periodic input signal; and generating a second mixed signal, comprising mixing the first mixed signal with the periodic input signal. Some embodiments comprise shifting a phase of the periodic input signal prior to generating the first mixed signal. Some embodiments comprise determining a phase of the first mixed signal; and shifting the phase of the periodic input signal in accordance with the phase of the first mixed signal. Some embodiments comprise dividing a frequency of the first mixed signal by M, wherein M is an integer greater than one.

In general, in one aspect, an embodiment features a circuit comprising: a frequency multiplier configured to multiply a frequency of a periodic input signal by N, wherein N is an integer greater than one, wherein the periodic input signal has a fundamental frequency Fin, and wherein the frequency multiplier provides a first output signal having a fundamental frequency N×Fin; and a frequency divider configured to divide the fundamental frequency N×Fin of the first output signal by M, wherein M is an integer greater than one.

Embodiments of the circuit can include one or more of the following features. Some embodiments comprise a multifunction radio comprising: the circuit; a first transceiver, wherein the first transceiver operates according to the first output signal; and a second transceiver, wherein the first transceiver operates according to at least one of the second output signals. In some embodiments, the first transceiver is compliant with all or part of IEEE standard 802.11a; and the second transceiver is compliant with all or part of IEEE standards 802.11b and 802.11g.

The details of one or more implementations are set forth in the accompanying drawings and the description below. Other features will be apparent from the description and drawings, and from the claims.

Figure 1:
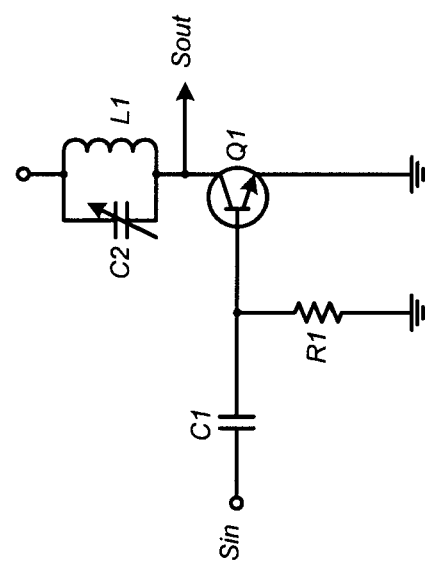
FIG. 1 shows a conventional circuit that is widely used for frequency tripling.

The leading digit(s) of each reference numeral used in this specification indicates the number of the drawing in which the reference numeral first appears.

DETAILED DESCRIPTION

Embodiments of the present disclosure provide frequency multipliers that employ self mixing. That is, the frequency multiplication of an input signal is achieved by mixing the input signal with itself. Several embodiments of frequency triplers are disclosed. However, each of these triplers is easily extended to obtain higher frequency multiples. Some embodiments also employ dividers to achieve fractional frequency multiplication, for example by multiplying the input frequency by 3/2.

Figure 3:
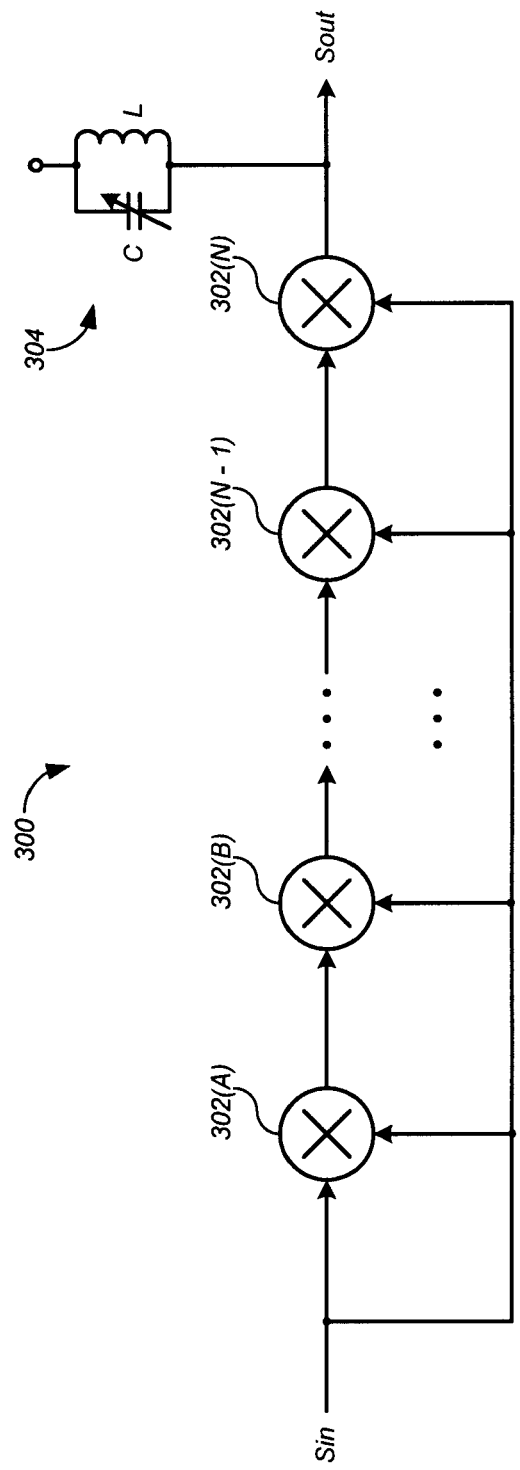
FIG. 3 shows a frequency multiplier according to one embodiment.

FIG. 3 shows a frequency multiplier 300 according to one embodiment. Although in the described embodiments the elements of frequency multiplier 300 are presented in one arrangement, other embodiments may feature other arrangements. Referring to FIG. 3, frequency multiplier 300 receives a periodic input signal Sin having a frequency Fin. For example, input signal Sin can be a sinusoid provided by a VCO or the like. Frequency multiplier 300 includes N multipliers 302(A) and 302(B) through 302(N−1) and 302(N), where N is an integer greater than one. Multipliers 302 are connected in series. Multiplier 302(A) mixes input signal Sin with itself. Each of the remaining multipliers 302 mixes input signal Sin with an output of the previous multiplier 302 in the series. That is, multiplier 302(B) mixes input signal Sin with the signal output by multiplier 302(A), and so on, until multiplier 302(N) mixes input signal Sin with the signal output by multiplier 302(N−1). The frequency of signal Sin is increased by Fin by each multiplier 302 so that the frequency of the signal output by multiplier 302(A) is 2Fin, the frequency of the signal output by multiplier 302(B) is 3Fin, and so on, so that the frequency of the signal output by multiplier 302(N−1) is N×Fin, and the frequency Fout of the signal output by multiplier 302(N) is Fout=(N+1)×Fin.

A tank circuit 304 comprising an inductor L and a capacitor C select the desired frequency component (N+1)×Fin. The values of L and C can be chosen according to equation (1).

$$(N-1) \times Fin = \frac{1}{2\pi\sqrt{LC}} \quad (1)$$

Multipliers 302 can be implemented as linear mixers or multipliers, so the efficiency of frequency multiplier 300 is high. In addition, multipliers 302 are operated in a linear region so the spectrum of output signal Sout is much cleaner that with conventional approaches.

Equations (2) through (4) illustrate the operation of frequency multiplier 300 for frequency tripling (that is, for N=2). Given that $$\omega_{in} = 2\pi F_{in} \quad (2)$$

the frequency tripling is given by $$\cos \omega_{in}t \times \cos \omega_{in}t \times \cos \omega_{in}t = 0.25 \cos 3\omega_{in}t + 0.75 \cos \omega_{in}t \quad (3)$$

where the output component at 3Fin is given by $$0.25 \cos 3\omega_{in}t \quad (4)$$

Figure 4:
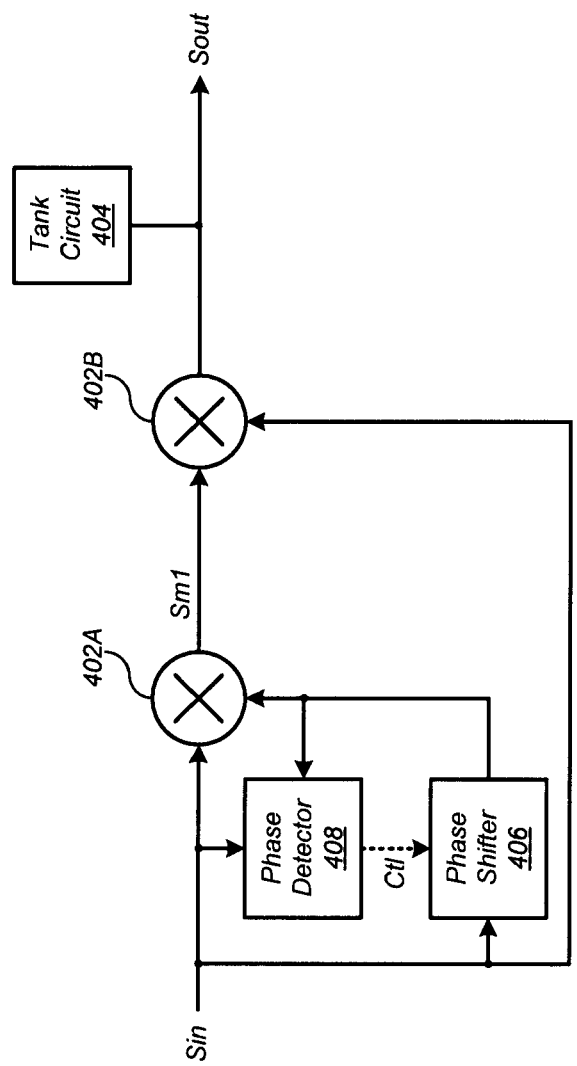
FIG. 4 shows a frequency tripler 400 where the phase of the input signal can be shifted prior to mixing according to one embodiment.

For a cleaner output spectrum, the phase of the input signal can be shifted prior to mixing. FIG. 4 shows a frequency tripler 400 according to such an embodiment. Although in the described embodiments the elements of frequency tripler 400 are presented in one arrangement, other embodiments may feature other arrangements. For example, frequency tripler 400 is easily extended to obtain higher frequency multiples by adding additional multipliers.

Referring to FIG. 4, frequency tripler 400 receives a periodic input signal Sin having a frequency Fin. For example, input signal Sin can be a sinusoid provided by a VCO or the like. Frequency tripler 400 includes two multipliers 402A and 402B connected in series, a tank circuit 404, a phase shifter 406, and a phase detector 408. Phase shifter 406 shifts the phase of input signal Sin by an angle φ. Multiplier 402A mixes input signal Sin with the output of phase shifter 406. Multiplier 402B mixes input signal Sin(without the phase shift) with the output of multiplier 402A.

Phase detector 408 detects the phase difference between input signal Sin and the output of phase shifter 406. In particular, phase detector 408 detects the DC level in the signals, for example using a low-pass filter. Phase shifter 406 changes the angle φ by which it shifts the phase of input signal Sin in accordance with the DC level detected by phase detector 408. In particular, phase shifter 406 tunes the angle φ so as to minimize the DC level. In other embodiments, the phase detection can be performed by multiplier 402A.

Equations (5) and (6) illustrate the operation of frequency tripler 400. Given that $$\omega_{in} = 2\pi F_{in} \quad (5)$$

the frequency tripling is given by:
after first-stage mixing:

$$\cos(\omega t+\phi)\times\cos(\omega t)=0.5\cos(2\omega t+\phi)+0.5\cos(\phi) \quad (6)$$

after second-stage mixing:

$$[0.5\cos(2\omega t+\phi)+0.5\cos(\phi)]\cos\omega t=0.25\cos(3\omega t+\phi)+ \\ 0.25\cos(\omega t+\phi)+0.5\cos(\phi)\cos\omega t \quad (7)$$

In equation (6) there is an undesirable component at Fin with magnitude $0.5\cos\phi$ due to the DC term $0.5\cos\phi$ generated at the output of first stage mixing. When phase shifter 406 sets $\phi=90°$, the magnitude of this undesirable component at Fin can be reduced to zero. In some embodiments, phase detector 408 is omitted, and the phase shift of phase shifter 406 is fixed at $\phi=90°$.

Figure 5:
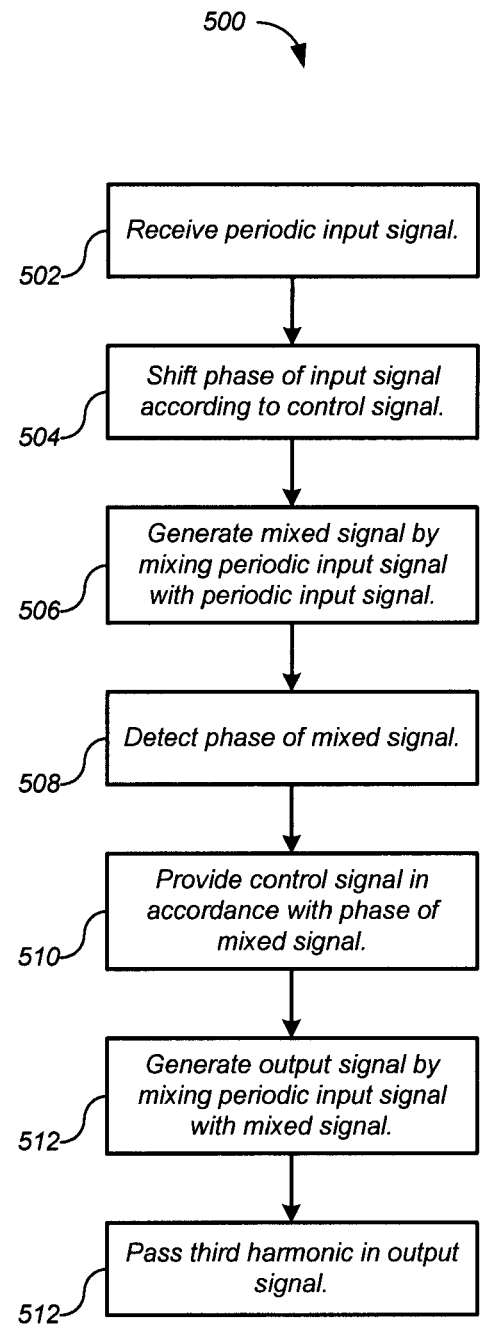
FIG. 5 shows a process for the frequency tripler of FIG. 4 according to one embodiment.

FIG. 5 shows a process 500 for frequency tripler 400 of FIG. 4 according to one embodiment. Although in the described embodiments the elements of process 500 are presented in one arrangement, other embodiments may feature other arrangements. For example, in various embodiments, some or all of the elements of process 500 can be executed in a different order, concurrently, and the like. Also some elements of process 500 may not be performed, and may not be executed immediately after each other.

Figure 6:
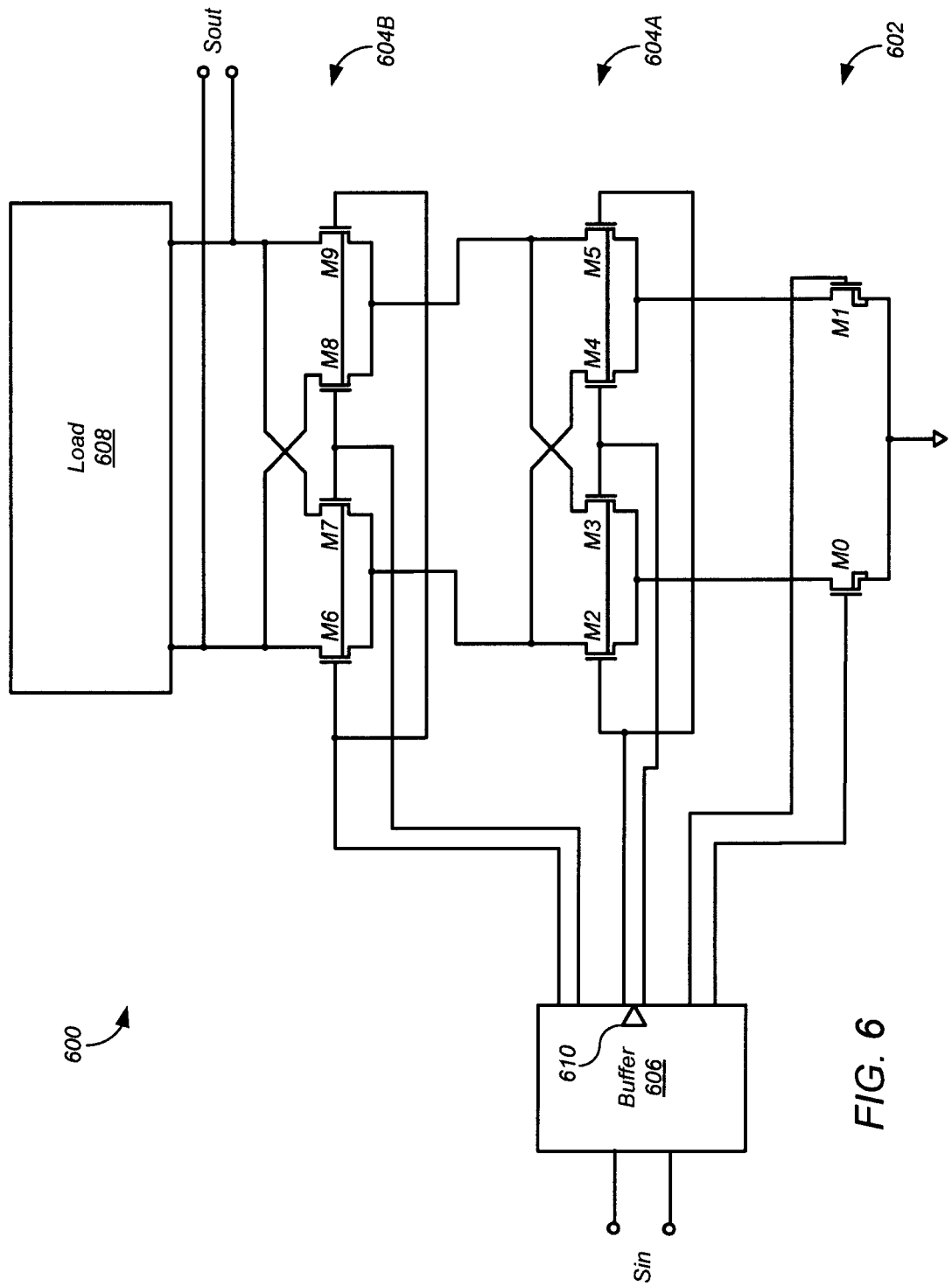
FIG. 6 shows an active frequency tripler employing a Gilbert cell according to one embodiment.

Referring to FIG. 5, at 502, frequency tripler 400 receives periodic input signal Sin having a fundamental frequency Fin. At 504, phase shifter 406 shifts the phase of input signal Sin according to a control signal Ctl provided by phase detector 408. At 506, multiplier 402A generates a mixed signal Sm by mixing periodic input signal Sin with periodic input signal Sin. At 508, phase detector 408 detects the phase of mixed signal Sm. At 510, phase detector 408 provides control signal Ctl in accordance with the phase of the mixed signal Sm. At 512, multiplier 402B generates output signal Sout by mixing periodic input signal Sin with mixed signal Sm. At 514, tank circuit 404 acts as a bandpass filter to pass the third harmonic Fout=3Fin in output signal Sout. FIG. 6 shows an active frequency tripler 600 employing a Gilbert cell according to one embodiment. Although in the described embodiments the elements of frequency tripler 600 are presented in one arrangement, other embodiments may feature other arrangements. For example, frequency tripler 600 is easily extended to obtain higher frequency multiples by adding additional multiplier stages.

Referring to FIG. 6, frequency tripler 600 includes a transconductance stage 602 and two active multiplier stages 604A and 604B. The combination of transconductance stage 602 and multiplier stage 604A constitutes a Gilbert cell. Frequency tripler 600 also includes a buffer 606 and a load 608. Buffer 606 provides input signal Sin to transconductance stage 602 and multiplier stages 604A and 604B. Buffer 606 includes a delay element 610 that imposes a 90° phase shift in input signal Sin before providing the phase-shifted signal to multiplier stage 604A. Delay element 610 can be made tunable to accommodate a wide range of input frequencies. Load 608 can be implemented as a tank circuit, resistive load, or the like.

In the embodiment of FIG. 6, transconductance stage 602 and multiplier stages 604A and 604B are implemented using n-channel metal-oxide-semiconductor field-effect (NMOS) transistors. However, other transistor technologies can be used instead. For example, transconductance stage 602 and multiplier stages 604A and 604B can be implemented using p-channel metal-oxide-semiconductor field-effect (PMOS) transistors, NPN or PNP bipolar junction transistors (BJT), or the like. The described embodiments can be implemented as one or more integrated circuits, as discrete components, as a combination of the two, or the like.

Transconductance stage 602 converts the voltage of signal Sin to current. Transconductance stage 602 includes two transistors M0 and M1 that are driven by input signal Sin. The sources of transistors M0 and M1 are grounded. The drains of transistors M0 and M1 provide current for multiplier stage 604A.

Each multiplier stage 604 includes two differential amplifiers. Each differential amplifier is implemented as a pair of source-connected transistors. The drains of the transistors in one differential amplifier are cross-connected to the drains in the other differential amplifier, as shown in FIG. 6. In multiplier 604A, transistors M2 and M3 form one differential amplifier, while transistors M4 and M5 form the other differential amplifier. In multiplier 604B, transistors M6 and M7 form one differential amplifier, while transistors M8 and M9 form the other differential amplifier.

One advantage of this active configuration is that the two multiplier stages 604A and 604B can be stacked, as shown in FIG. 6. This stacked configuration requires only one bias current instead of the two bias currents required by a non-stacked configuration. This reduction in current results in a reduction in power consumption as well.

Figure 7:
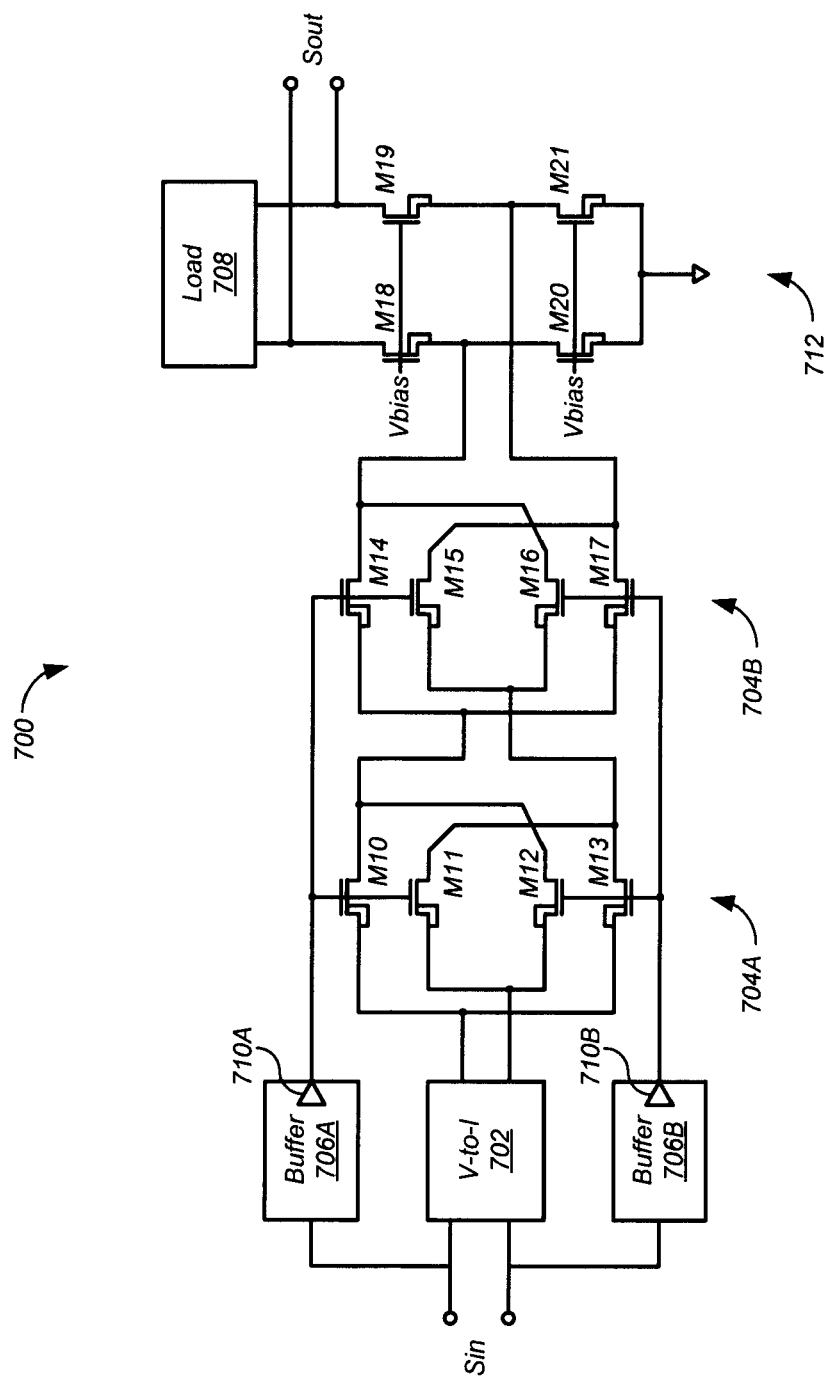
FIG. 7 shows a passive frequency tripler according to one embodiment.

FIG. 7 shows a passive frequency tripler 700 according to one embodiment. That is, the multipliers in passive frequency tripler 700 are passive. Although in the described embodiments the elements of frequency tripler 700 are presented in one arrangement, other embodiments may feature other arrangements. For example, frequency tripler 700 is easily extended to obtain higher frequency multiples by adding additional multiplier stages.

Referring to FIG. 7, frequency tripler 700 includes a transconductance (V-to-I) stage 702, two passive multiplier stages 704A and 704B, and an output stage 712. Frequency tripler 700 also includes two buffers 706A and 706B and a load 708. Each buffer 706 provides input signal Sin to multiplier stages 704A and 704B. Each buffer 706 includes a respective delay element 710A,B that imposes a 90° phase shift in input signal Sin before providing the phase-shifted signal to multiplier stages 704. Delay elements 710 can be made tunable to accommodate a wide range of input frequencies. Load 708 can be implemented as a tank circuit, resistive load, or the like.

In the embodiment of FIG. 7, multiplier stages 704A and 704B are implemented using NMOS transistors. However, other transistor technologies can be used instead. For example, multiplier stages 704 can be implemented using PMOS transistors, NPN or PNP BJT transistors, or the like. The described embodiments can be implemented as one or more integrated circuits, as discrete components, as a combination of the two, or the like.

Transconductance stage 702 converts the voltage of signal Sin to current, and can be implemented, for example, as shown for transconductance stage 602 in FIG. 6.

Each multiplier stage 704 includes two differential transistor pairs. Each differential transistor pair is implemented as a pair of source-connected transistors. In each multiplier stage 704, the drains of the transistors in one differential pair are cross-connected to the drains in the other differential pair, as shown in FIG. 7. In multiplier 704A, transistors M10 and M13 form one differential pair, while transistors M11 and M12 form the other differential pair. In multiplier 704B, transistors M14 and M17 form one differential pair, while transistors M15 and M16 form the other differential pair.

Output stage 712 includes load 708 and a stack of two transistor pairs. One transistor pair includes transistors M18 and M19. The other transistor pair includes transistors M20 and M21. The gates of the transistors in output stage 712 are biased on with a bias voltage Vbias.

One advantage of this passive configuration is that it does not require a high supply voltage compared to an active configuration. In addition, no DC current flows through multiplier stages 704A and 704B, resulting in low flicker noise and better linearity.

Figure 8:
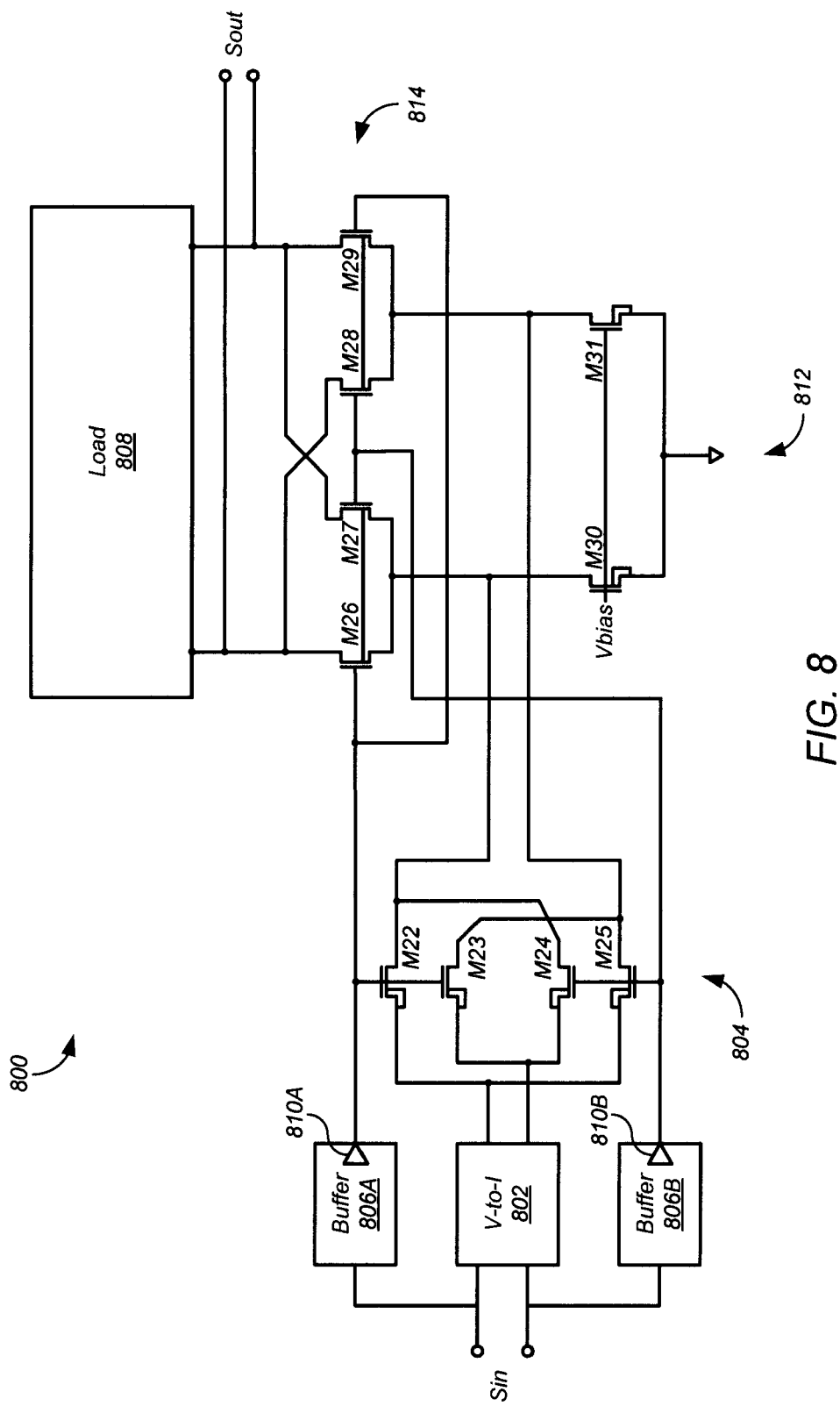
FIG. 8 shows an active/passive frequency tripler according to one embodiment.

FIG. 8 shows an active/passive frequency tripler 800 according to one embodiment. That is, one of the multipliers in frequency tripler 700 is passive, and the other multiplier is active. Although in the described embodiments the elements of frequency tripler 800 are presented in one arrangement, other embodiments may feature other arrangements. For example, frequency tripler 800 is easily extended to obtain higher frequency multiples by adding additional passive and/or active multiplier stages.

Referring to FIG. 8, frequency tripler 800 includes a transconductance (V-to-I) stage 802, a passive multiplier stage 804, an active multiplier stage 814, and an output stage 812. Frequency tripler 800 also includes two buffers 806A and 806B and a load 808. Each buffer 806 provides input signal Sin to multiplier stages 804 and 814. Each buffer 806 includes a respective delay element 810A,B that imposes a 90° phase shift in input signal Sin before providing the phase-shifted signal to multiplier stages 804 and 814. Delay elements 810 can be made tunable to accommodate a wide range of input frequencies. Load 808 can be implemented as a tank circuit, resistive load, or the like.

In the embodiment of FIG. 8, multiplier stages 804 and 814 are implemented using NMOS transistors. However, other transistor technologies can be used instead. For example, multiplier stages 804 and 814 can be implemented using PMOS transistors, NPN or PNP BJT transistors, or the like. The described embodiments can be implemented as one or more integrated circuits, as discrete components, as a combination of the two, or the like.

Transconductance stage 802 converts the voltage of signal Sin to current, and can be implemented, for example, as shown for transconductance stage 602 in FIG. 6.

Passive multiplier stage 804 includes two differential transistor pairs. Each differential transistor pair is implemented as a pair of source-connected transistors. The drains of the transistors in one differential pair are cross-connected to the drains in the other differential pair, as shown in FIG. 8. In multiplier 804, transistors M22 and M25 form one differential pair, while transistors M23 and M24 form the other differential pair.

Active multiplier stage 814 includes two differential amplifiers. Each differential amplifier is implemented as a pair of source-connected transistors. The drains of the transistors in one differential amplifier are cross-connected to the drains in the other differential amplifier, as shown in FIG. 8. In multiplier 814, transistors M26 and M27 form one differential amplifier, while transistors M28 and M29 form the other differential amplifier.

Figure 9:
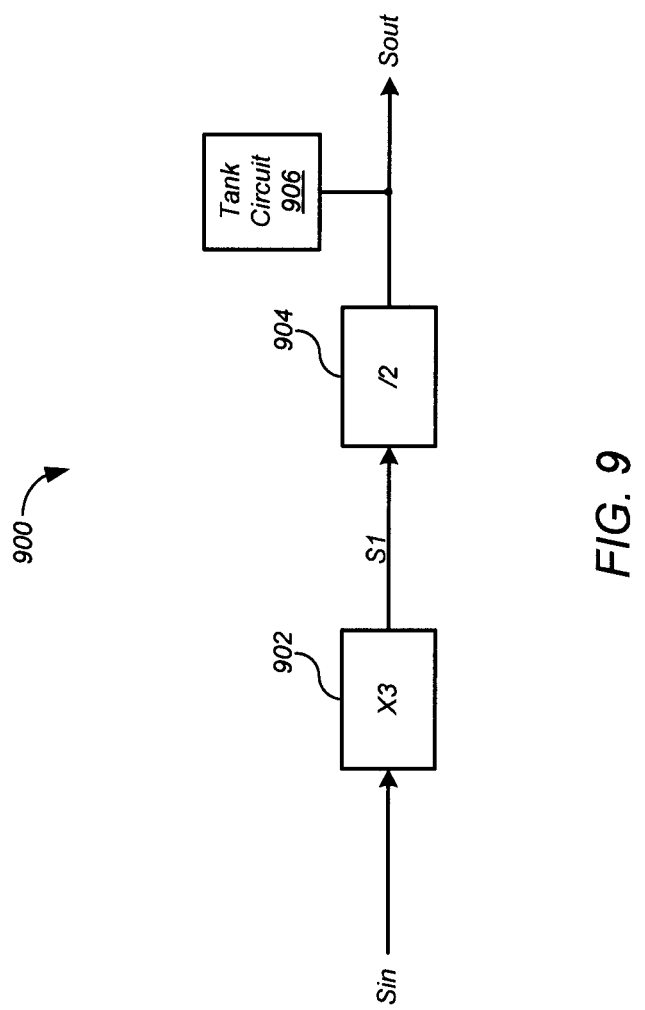
FIG. 9 shows a frequency multiplier for fractionally increasing the frequency of a signal according to one embodiment.

Output stage 812 includes load 808 and one transistor pair. The transistor pair includes transistors M30 and M31. The gates of the transistors in output stage 812 are biased on with a bias voltage Vbias. FIG. 9 shows a frequency multiplier 900 for fractionally increasing the frequency of a signal according to one embodiment. Although in the described embodiments the elements of frequency multiplier 900 are presented in one arrangement, other embodiments may feature other arrangements. For example, while the embodiment of FIG. 9 multiplies the input frequency by 3/2, other embodiments multiply the input frequency by other fractions N/M where N is an integer greater than 2, and M is an integer greater than 1.

Referring to FIG. 9, frequency multiplier 900 includes a frequency tripler 902, a frequency divider 904, and a tank circuit 906. Frequency multiplier 900 can be implemented according to the techniques described herein, conventional techniques, or any combination thereof. In other embodiments, frequency multiplier 900 can be extended to other multiples.

Frequency divider 904 can be implemented according to conventional techniques. In the embodiment of FIG. 4, frequency divider 904 is implemented as a divide-by-two divider. In other embodiments, frequency divider 904 can be implemented as a divide-by-M divider, where M is an integer greater than 1.

Frequency multiplier 900 multiplies the frequency Fin of a periodic input signal Sin by 3/2. In particular, frequency tripler 902 triples the frequency Fin of signal Sin so the output S1 of frequency tripler 902 has a frequency 3Fin. Frequency divider 904 divides the frequency of the resulting signal by 2, so that the output signal Sout has a frequency Fout=3Fin/2. Tank circuit 906 acts as a bandpass circuit to pass frequency Fout in output signal Sout.

Figure 2:
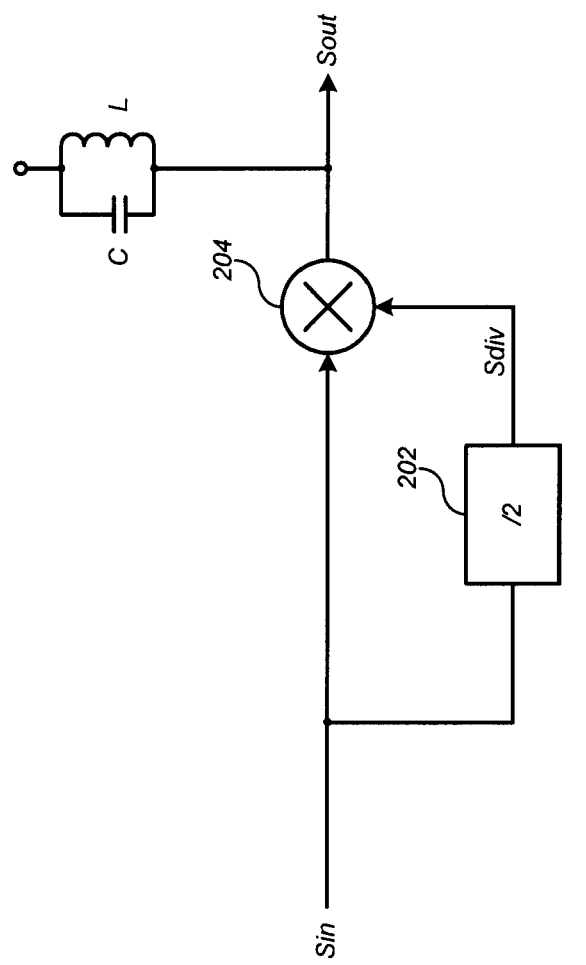
FIG. 2 shows a conventional circuit for multiplying the frequency of a signal by 3/2.

Frequency multiplier 900 has several advantages over conventional schemes. Compared with conventional approaches such as that of FIG. 2, output signal Sout has little or no spur at Fout/3 because frequency multiplier 900 has no circuits running at Fout/3. Also, conventional dividers produce signals that are out-of-phase by 90°. These signals can be output by frequency divider 904 as in-phase and quadrature clock signals.

Figure 10:
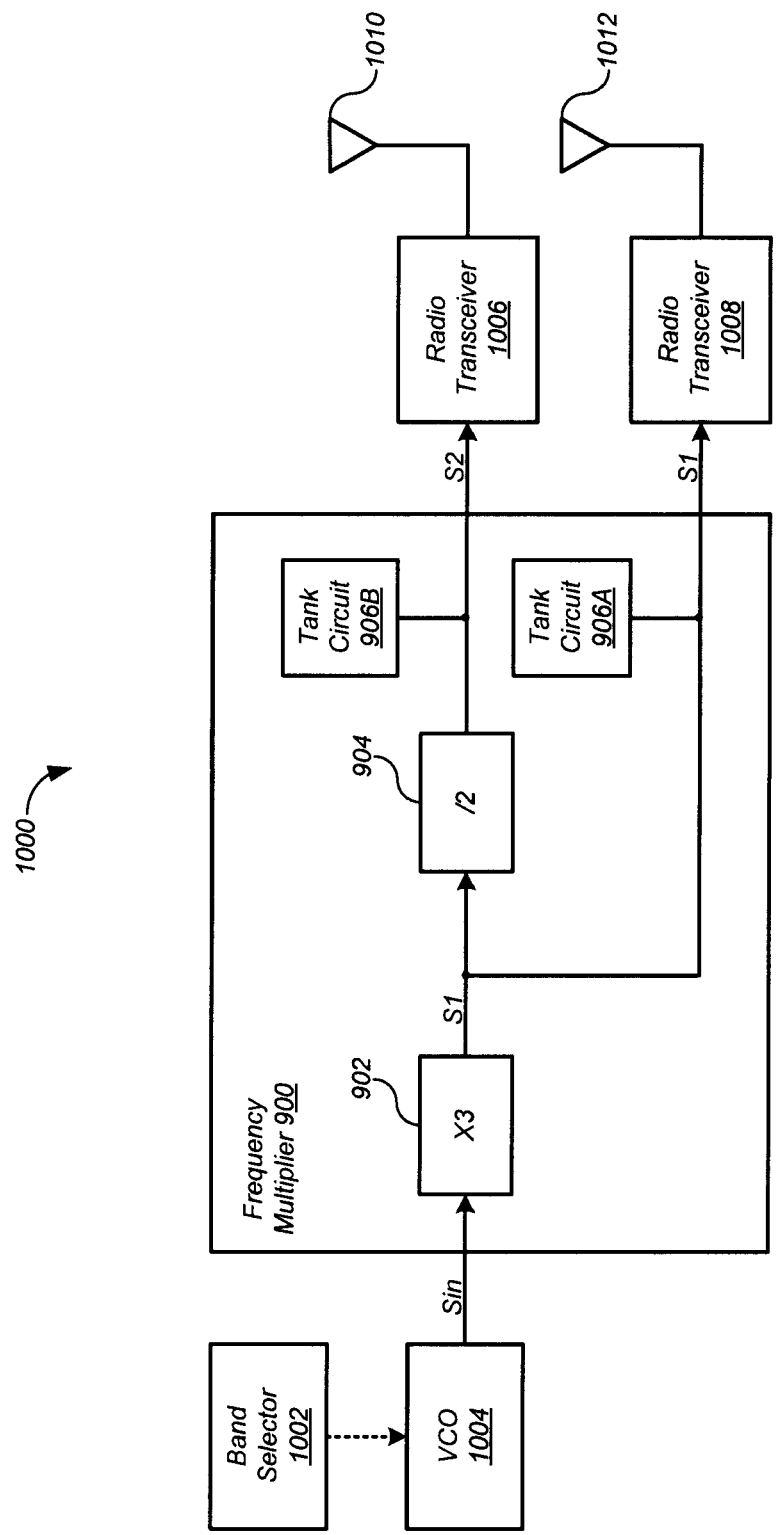
FIG. 10 shows a multifunction radio that employs the frequency multiplier of FIG. 9 according to one embodiment.

Another advantage of frequency multiplier 900 is that signal S1 can be utilized as well, as illustrated in FIG. 10. FIG. 10 shows a multifunction radio 1000 that employs frequency multiplier 900 of FIG. 9 according to one embodiment. Multifunction radio 1000 includes a band selector 1002, a voltage-controlled oscillator (VCO) 1004, frequency multiplier 900, two radio transceivers 1006 and 1008, and two antennas 1010 and 1012.

VCO 1004 provides signal Sin having frequency Fin under the control of band selector 1002. Frequency tripler 902 triples the frequency Fin of signal Sin, resulting in signal S1, which has a frequency F1=3Fin. In this embodiment, frequency multiplier 900 includes a tank circuit 906A that acts as a bandpass filter to pass frequency F1 as a clock signal to transceiver 1008.

Frequency divider 904 divides the frequency F1 of signal S1 by 2, resulting in signal S2, which has a frequency F2=3Fin/2. Frequency multiplier 900 includes a tank circuit 906B that acts as a bandpass filter to pass frequency F2 as a clock signal to transceiver 1006.

In some embodiments, multifunction radio 1000 is compliant with all or part of IEEE standard 802.11, including draft and approved amendments such as 802.11a, 802.11b, 802.11e, 802.11g, 802.11i, 802.11k, 802.11n, 802.11v, and 802.11w. For example, transceiver 1006 can be implemented as an IEEE 802.11b/g radio, while transceiver 1008 can be implemented as an IEEE 802.11a radio. The 802.11a band lies at roughly twice the frequency of the 802.11a band so that clock signal S2 can be used for 802.11b/g radio 1006, while clock signal S1 can be used for 802.11a radio 1008. Band selector 1002 can tune the frequency of input signal Sin as needed when switching between bands.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. A frequency multiplier comprising:
   N multipliers, wherein N is an integer greater than one,
   wherein the multipliers are connected in series such that each of the multipliers, except for a first one of the multipliers, is configured to mix a periodic input signal with an output of another respective one of the multipliers, and
   wherein the first one of the multipliers is configured to mix the periodic input signal with the periodic input signal.

2. The frequency multiplier of claim 1, wherein the periodic input signal has a fundamental frequency Fin, and wherein the frequency multiplier further comprises:
   a bandpass filter configured to pass an output frequency Fout, wherein Fout=(N+1)×Fin.

3. The frequency multiplier of claim 2, further comprising:
   a phase shifter configured to shift a phase of the periodic input signal,
   wherein the first one of the multipliers is further configured to mix the periodic input signal with the periodic input signal subsequent to the phase shifter shifting the phase.

4. The frequency multiplier of claim 3, further comprising:
   a phase detector configured to determine a phase of a signal output by the first one of the multipliers,
   wherein the phase shifter is further configured to shift the phase of the periodic input signal in accordance with the phase of the signal output by the first one of the multipliers.

5. The frequency multiplier of claim 3, further comprising:
   a Gilbert cell, wherein the Gilbert cell comprises
       the first one of the multipliers; and
       a transconductance stage.

6. The frequency multiplier of claim 5, wherein each of the multipliers comprises:
   two differential amplifiers;
   wherein each differential amplifier comprises a respective pair of metal-oxide-semiconductor field-effect transistors (MOSFETs);
   wherein a source of a first one of the MOSFETs in each pair is connected to a source of a second one of the MOSFETs in the respective pair; and
   wherein a drain of each MOSFET in a first one of the pairs is connected to a drain of a respective one of the MOSFETs in a second one of the respective pairs.

7. The frequency multiplier of claim 1, wherein:
   the multipliers are passive.

8. The frequency multiplier of claim 1, wherein:
   the first one of the multipliers is active; and
   each of the multipliers, except for the first one of the multipliers, is passive.

9. A circuit comprising:
   the frequency multiplier of claim 1; and
   a frequency divider configured to divide output frequency Fout by M, wherein M is an integer greater than 1.

10. A method comprising:
    receiving a periodic input signal;
    generating a first mixed signal, comprising mixing the periodic input signal with the periodic input signal; and
    generating a second mixed signal, comprising mixing the first mixed signal with the periodic input signal.

11. The method of claim 10, further comprising:
    generating a third mixed signal, comprising mixing the second mixed signal with the periodic input signal.

12. The method of claim 10, wherein the periodic input signal has a fundamental frequency Fin, and wherein the method further comprises:
    passing an output frequency Fout, wherein Fout=3Fin.

13. The method of claim 12, further comprising:
    shifting a phase of the periodic input signal prior to generating the first mixed signal.

14. The method of claim 13, further comprising:
    determining a phase of the first mixed signal; and
    shifting the phase of the periodic input signal in accordance with the phase of the first mixed signal.

15. The method of claim 10, further comprising:
    dividing a frequency of the first mixed signal by M, wherein M is an integer greater than one.

16. A circuit, comprising:
    a frequency multiplier configured to multiply a frequency of a periodic input signal by N, wherein N is an integer greater than one, wherein the periodic input signal has a fundamental frequency Fin, and wherein the frequency multiplier provides a first output signal having a fundamental frequency N×Fin; and
    a frequency divider configured to divide the fundamental frequency N×Fin of the first output signal by M, wherein M is an integer greater than one, and wherein M and N are different.

17. A circuit, comprising:
    a frequency multiplier configured to multiply a frequency of a periodic input signal by N, wherein N is an integer greater than one, wherein the periodic input signal has a fundamental frequency Fin, and wherein the frequency multiplier provides a first output signal having a fundamental frequency N×Fin; and
    a frequency divider configured to divide the fundamental frequency N×Fin of the first output signal by M, wherein M is an integer greater than one, wherein
    N=3, and
    M=2.

18. The circuit of claim 17, wherein:
the frequency divider is further configured to provide an in-phase second output signal and a quadrature second output signal, wherein the in-phase second output signal has a fundamental frequency N×Fin/M, and wherein the quadrature second output signal has a fundamental frequency N×Fin/M.

19. A multifunction radio comprising:
the circuit of claim 18;
a first transceiver, wherein the first transceiver operates according to the first output signal; and
a second transceiver, wherein the first transceiver operates according to at least one of the second output signals.

20. The multifunction radio of claim 19, wherein:
the first transceiver is compliant with all or part of IEEE standard 802.11a; and
the second transceiver is compliant with all or part of IEEE standards 802.11b and 802.11g.

\* \* \* \* \*